United States Patent [19]

Kita et al.

[11] Patent Number: 4,717,261

[45] Date of Patent: Jan. 5, 1988

[54] RECORDING/REPRODUCING APPARATUS INCLUDING SYNTHESIZED VOICE CONVERTER

[75] Inventors: Kazunori Kita; Hideyuki Shoji; Toshiharu Aihara, all of Tokyo, Japan

[73] Assignee: Casio Computer Co., Ltd., Tokyo, Japan

[21] Appl. No.: 817,054

[22] Filed: Jan. 8, 1986

[30] Foreign Application Priority Data

Jan. 16, 1985 [JP] Japan .............................. 60-2818[U]
Jan. 16, 1985 [JP] Japan .................................... 60-4041

[51] Int. Cl.⁴ ....................... G04B 21/08; G11C 27/00

[52] U.S. Cl. ........................................ 368/63; 365/45; 381/51

[58] Field of Search ....................... 368/10, 63, 72–75, 368/250–251; 360/8, 32; 365/45; 369/20, 23; 364/900, 705, 710; 381/51

[56] References Cited

U.S. PATENT DOCUMENTS

| | | | |
|---|---|---|---|
| 4,318,188 | 3/1982 | Hoffmann | 365/45 |
| 4,368,988 | 1/1983 | Tahara et al. | 368/251 |
| 4,388,000 | 6/1983 | Hagihira | 368/273 |
| 4,391,530 | 7/1983 | Wakabayashi et al. | 368/63 |
| 4,472,069 | 9/1984 | Yamamoto | 368/273 |
| 4,548,511 | 10/1985 | Yase | 368/63 |

*Primary Examiner*—Vit W. Miska

*Attorney, Agent, or Firm*—Frishauf, Holtz, Goodman & Woodward

[57] ABSTRACT

In a recording/reproducing apparatus, voice message information is encoded into voice message data by an encoder, and keyed in data information is converted into synthesizing speech data by a speech synthesizing circuit. Both the voice message data and the synthesized speech data are separately stored in a semiconductor memory. The speech data is independently read out from the semiconductor memory.

23 Claims, 18 Drawing Figures

ADDRESS CONTROL 715

RECORDING/REPRODUCING APPARATUS INCLUDING SYNTHESIZED VOICE CONVERTER

BACKGROUND OF THE INVENTION

1. Field of the Invention

The present invention relates to a recording/reproducing apparatus including a digital memory device for recording not only major sound information such as voice messages but also auxiliary information such as date and telephone numbers in a sound form, so as to reproduce the major information in conjunction with the auxiliary information.

2. Description of Prior Art

In a small electronic appliance having recording functions, a magnetic recording tape and a disc are employed for recording voices, music and so on. Recently, a semiconductor random access memory (RAM) is utilized as a recording medium to record voice data and music data in a digital form. Such a semiconductor recording medium built in a small electronic appliance is known, for instance, from U.S. Pat. No. 4,391,530 to Wakabayashi, issued on July 5, 1983.

In this U.S. patent, a voice message is input to a time piece through an acoustic converter. Then the voice message signal is encoded by a predetermined sampling frequency into digital voice data. The voice data is sequentially stored in the semiconductor memory (RAM), while the memory addresses are successively used to designate the memory regions, so that the encoded voice message, or the voice data is sequentially stored, or recorded in the memory regions designated in RAM.

When the preset alarm time is reached, the memory regions of the semiconductor memory are sequentially addressed the same as in the recording mode so as to read out the voice data therefrom, thereby decoding the voice data to reproduce the stored voice message.

When a large memory such as capacity semiconductor memory a 32-Kbit random access memory is employed, and the sampling frequency is selected to be 4 KHz, the total recording/reproducing time amounts to approximately 8 seconds. In a conventional recording/reproducing apparatus, such a semiconductor memory having a large memory capacity cannot function at all when the alarm time is not preset, or no reproduction of the voice message is required when the preset alarm time is reached. Even if the voice message needs to be reproduced, if the recording time for this voice message is only about 5 seconds, a memory capacity of approximately 12 kilobits will not be used, i.e., approximately 3 seconds of the voice reproduction. This causes a waste of the available memory regions of the semiconductor memory.

It is therefore an object of the present invention to provide a recording/reproducing apparatus including a digital memory device, in which remaining memory regions that have not been used during the recording/reproducing modes are available for different data storing purposes.

SUMMARY OF THE INVENTION

The object and features of the present invention may be accomplished by providing a recording/reproducing apparatus comprising means for encoding input voice message information into voice message data, means for inputting data information in a digital form, first storage means including at least first and second storage regions, for temporarily storing at least said voice message data into the first storage region, recording control means for controlling said digital data information to be separately recorded in the second storage region where no voice message data has been stored, reading control means for controlling said digital data information to be read out from the second storage region, means for decoding at least said voice message data read out from the first storage region so as to derive an analog voice message signal, and, means for converting at least the analog voice message signal so as to reproduce the input voice message information as acoustic sounds.

In accordance with the present invention, since the digital memory device can store not only the voice message data but also the other necessary data, the recording efficiency of the memory device is considerably increased. As a result, even with the smaller memory capacity of the digital memory typically employed in such a small electronic appliance, e.g., an electronic wrist watch, the greater recording efficiency can be expected, as compared with the conventional small electronic appliance containing a digital memory device.

BRIEF DESCRIPTION OF THE DRAWINGS

This as well as other objects and advantages of the invention will be better appreciated upon reading the following detailed description of the presently preferred exemplary embodiments in conjunction with the accompanying drawings, in which.

DETAILED DESCRIPTION OF THE PREFERRED EMBODIMENTS FIRST MODE OF ELECTRONIC WRIST WATCH

Figure 1A:
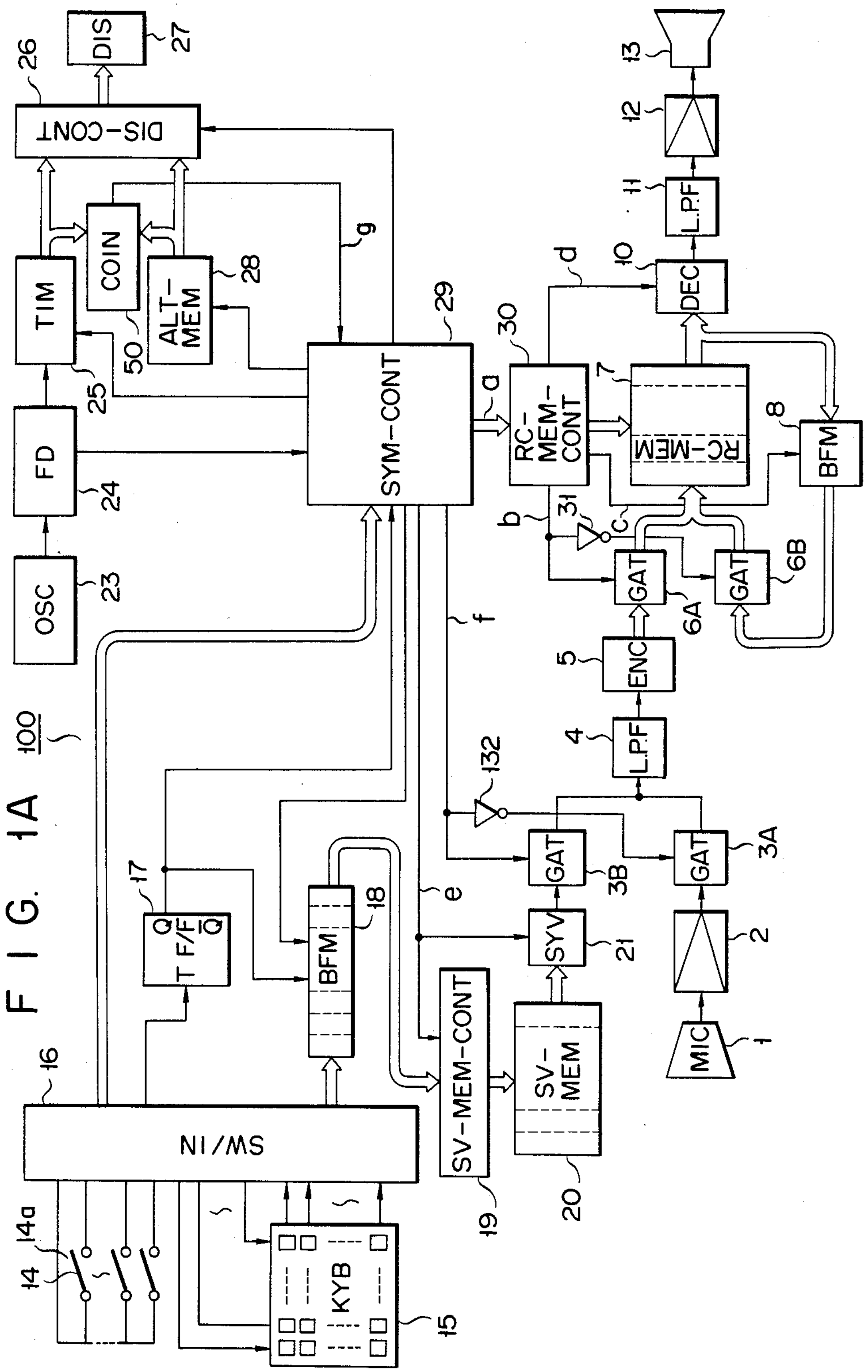
FIG. 1A is a block diagram of an electronic wrist watch employing a recording/reproducing apparatus according to a first preferred embodiment.

Referring to a circuit block diagram as shown in FIG. 1A, a description will now be made of an electronic wrist watch including recording/reproducing apparatus according to a first preferred embodiment of the invention.

Before proceeding with the detail description of the electronic wrist watch, the principles of the first preferred embodiment will now be summarized. In the RAM (random access memory) for recording the voice message data as major sound information externally supplied through an acoustic converter by an operator, keyed-in characters and words are separately recorded as auxiliary sound information after being converted into corresponding synthesized voice or speech data. The synthesized voice data can be recorded not only in an intermediate portion of the previously recorded voice message data, but also at the front or end portion thereof. Accordingly, the keyed-in characters and words can be reproduced as a voice, or speech from the electronic wrist watch.

Referring back to the circuit diagram of FIG. 1A, an arrangement 100 of the electronic wrist watch will be described.

First, in the diagram, a microphone 1, an amplifier 2, a transfer gate 3A, a low-pass filter 4, an encoding circuit 5 including an A/D converter, a transfer gate 6A, a recording memory 7, a decoding circuit 10 including a D/A converter, a low-pass filter 11, an amplifier 12, and a speaker 13 are connected in series, and are well-known voice recording/reproducing means, respectively. See, for example, U.S. Pat. Nos. 4,368,988 and 4,391,530 which are incorporated herein by reference. A circular or feedback circuit consisting of a buffer memory 8 and a transfer gate 6B is connected to recording memory 7. When voice synthesizing or speech synthesizing data which is input from a keyboard 15 and interposed into voice message data preset in recording memory 7, this circular circuit temporarily transfers and protects the voice message data stored at the location after the interposing location with regard to the recording time into buffer memory 8 and, after completion of the insertion of the data, this circular circuit newly writes this voice message data into the area after the interposing location.

Recording memory 7 is constituted by e.g., a 256-Kbit RAM (random access memory) and address-controlled by a recording memory control circuit 30 which receives control data and a control signal "a" from a system control circuit 29. Another control signal "b" which is output from recording memory control circuit 30 is supplied to transfer gates 6A and 6B directly or through an inverter 31, respectively, so as to open and close transfer gates 6A and 6B. Buffer memory 8 and decoding circuit 10 also receive other corresponding control signals "c" and "d" from recording memory control circuit 30 for operations.

Each switch of an operation switch terminal 14 is used to correct the latest time, set an alarm time, set various kinds of modes, or the like. An output of each switch is input to a switching input circuit 16, by which the on-off state of this output signal is discriminated. The data indicative of the result of this discrimination is sent to system control circuit 29, so that the operation in the mode corresponding to this discrimination data is executed.

An output of a data recording mode setting switch 14a in the operation switch terminal 14 is transmitted to a T input terminal of a T-type flip-flop 17 through switching input circuit 16, thereby allowing the binary operation to be executed and its set output to be inverted such that "1"→"0"→"1"→. . . . This set output is supplied to system control circuit 29 and a buffer memory 18. For example, when the set output is "1", the operation in the data recording mode is executed.

Keyboard 15 is provided with various kinds of keys to insert (record) characters, numerals, or the like as synthesized voice data into recording memory 7. These keys are arranged in a matrix form. Outputs of those keys are periodically scanned by switching input circuit 16 and are again supplied into switching input circuit 16. These outputs are sequentially written into buffer memory 18. For example, assuming that data such as characters or the like capable of display as digits of a display device 27 has been written into buffer memory 18, this data is transmitted to a synthesizing voice data memory (constructed of a read only memory) 20 through a synthesizing voice memory control circuit 19. Hence, the synthesizing voice data of characters or the like is read out from data memory 20 and given to a voice synthesizing circuit 21 for the voice synthesizing process. The voice synthesizing circuit 21 synthesizes the voice data and this synthesized voice data is transmitted through a transfer gate 3B, low-pass filter 4, coding circuit 5, and transfer gate 6A and recorded as the synthesizing voice data at the address location in recording memory 7 designated at that time.

In this case, both synthesizing voice memory control circuit 19 and voice synthesizing circuit 21 receive a control signal "e" from system control circuit 29. Transfer gates 3A and 3B receive a control signal "f" from system control circuit 29 directly or through an inverter 132, so that the opening and closing of these transfer gates are controlled, respectively.

An oscillator 23, a frequency dividing circuit 24, a time counting circuit 25, a display control circuit 26, and a display device 27 constitute a conventional time keeping circuit to make and display time data. An alarm time is set to an alarm time memory 28 in response to normal switch operation of operation switch terminal 14 since the timer circuit has an alarm function. The alarm time set in alarm time memory 28 is sent to a coincidence circuit 50 and compared with the time data from time counting circuit 25. When this alarm time data coincides with the set alarm time, a coincidence detection signal g is sent to system control circuit 29. When the alarm time is reached, the contents of the recording memory, i.e., the voice message and the input data, are reproduced from speaker 13 under control of system control circuit 29.

The alarm time signal is also sent to display device 27 through display control circuit 26, so that the alarm time is displayed if necessary.

A signal having a predetermined frequency which is sent from frequency dividing circuit 24 is sent to system control circuit 29 and used as a system clock pulse. The time counting circuit 25, alarm time memory 28, and display control circuit 26 also receive the corresponding control signals from system control circuit 29 and operate, respectively.

The circuitry having only the function of an electronic wrist watch is omitted from the block diagram shown in FIG. 1A.

Figure 1B:
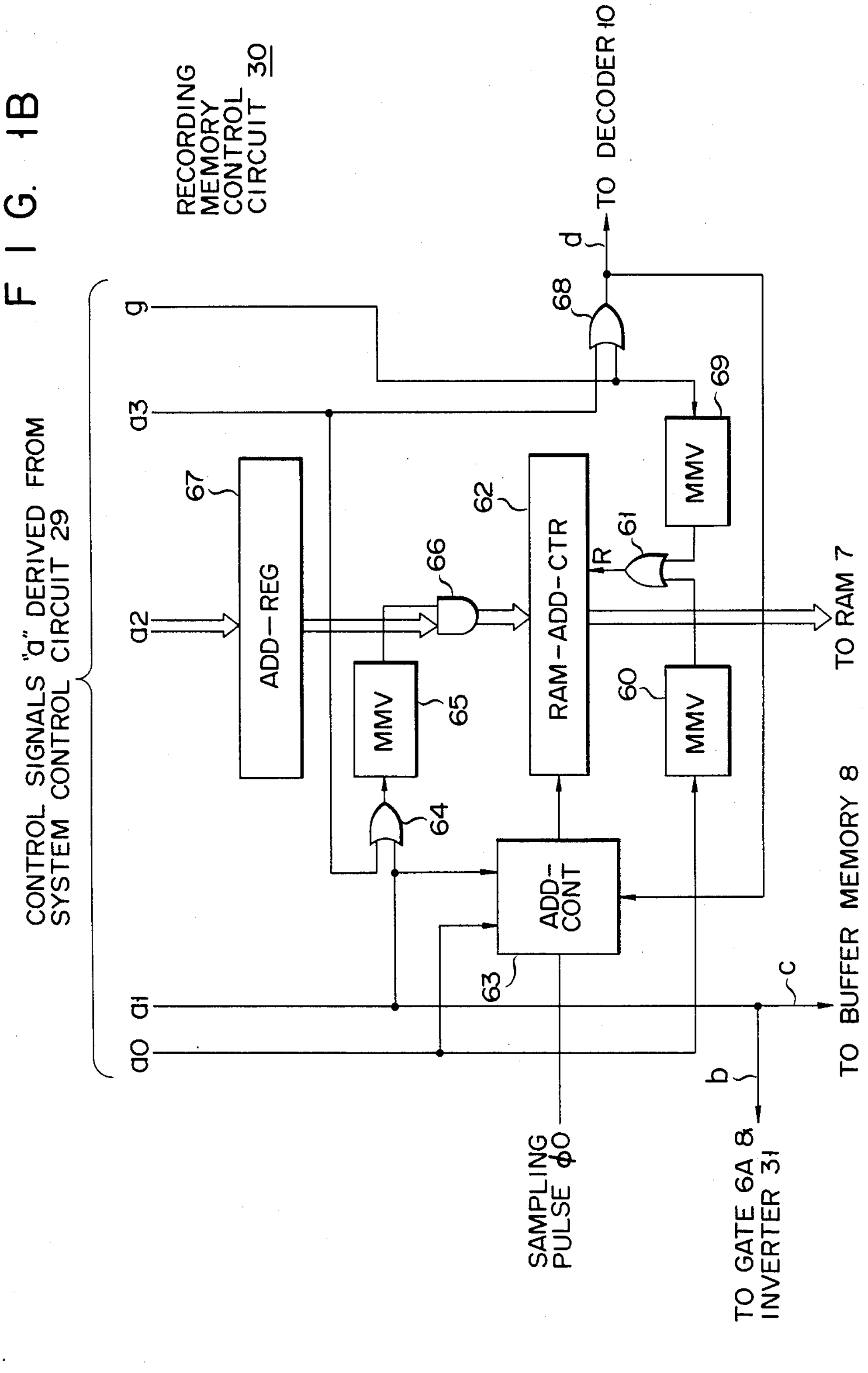
FIG. 1B is a block diagram of an internal circuit of the memory control circuit 30 shown in FIG. 1A.

In FIG. 1B, a detailed circuit arrangement of the memory control circuit 30 as shown in FIG. 1A is illustrated.

The control signal "a" includes a control signal "$a_0$" for writing the voice message data obtained from microphone 1 into RAM 7, a control signal "$a_1$" for writing the synthesizing voice data into RAM 7, an address signal "$a_2$" for indicating a first address when the synthesizing voice data is written in RAM 7, a control signal "$a_3$" for reading the synthesizing voice data out from RAM 7, and a coincidence signal "g" for detecting the coincidence between the preset alarm time and the present time. The first control signal "$a_0$" is supplied to a reset terminal of a RAM address counter 62, through a mono-multivibrator 60 and an OR gate 61, for designating addresses of RAM 7, and also to an address control circuit 63. The addresses of RAM 7 are sequentially counted up by supplying a sampling pulse $\phi_0$ to RAM address counter 62.

The control signal "$a_1$" is supplied as a gating control signal to AND gate 66 via OR gate 64 and mono-multivibrator 65. Also, this gate signal "$a_1$" is supplied to RAM address counter 62 upon supply of the sampling pulse $\phi_0$ thereto. The control signal "$a_1$" is utilized as the above-mentioned control signals "b" and "c". Since in AND gate 66, the contents of the address register 67, i.e., the first address being preset when the synthesizing voice data is written in RAM 7 have been stored under the control of the control signal "$a_2$", these contents are preset in RAM address counter 62.

The control signal "$a_3$" is supplied to OR gate 64 and derived as the control signal "d" through OR gate 68, while the coincidence signal "g" is supplied to the reset terminal of RAM address counter 62 via mono-multivibrator 69 and OR gate 61. The output signal of OR gate 68 is also supplied to address control circuit 63 so as to transfer the sampling pulse $\phi_0$ to RAM address counter 62.

The operation of this first arrangement 100 will now be described.

First, the voice input mode is performed by setting a predetermined switch in operation switch terminal 14. A control signal "f" of "0" is output from system control circuit 29 to open the transfer gate 3A and close the transfer gate 3B. The control signal "$a_0$" of system control circuit 29 is supplied to memory control circuit 30 so as to reset RAM address counter 30.

When message words are then input as a voice from microphone 1, this voice message data is processed and transmitted through amplifier 2, transfer gate 3A, low-pass filter 4, coding circuit 5, and transfer gate 6A in a manner similar to that described in U.S. Pat. No. 4,391,530. This voice message data is time sequentially written as serial data into recording memory 7 from the head address.

When interposing the synthesizing voice data into the intermediate or rear portion of the voice message data preset into recording memory 7 in this manner, flip-flop 17 is set by a predetermined switch operation and the data recording mode is set. Thus, buffer memory 18, synthesizing voice memory control circuit 19, and voice synthesizing circuit 21 are made operative. In addition, transfer gate 3B is opened and transfer gate 3A is closed in response to the control signal "f" of "1".

Next, for example, when the interposing head address for the location address of RAM 7 is input by the key operation of keyboard 15, this head address is stored as the control signal "$a_2$" through system control circuit 29 into address register 67 of recording memory control circuit 30.

Then, the necessary input data of characters, numerals, or the like is input from keyboard 15, into buffer memory 18 through switching input circuit 16. Thereafter, for instance, when character data capable of display as digits of display device 27 is input, the data in buffer memory 18 is transferred to synthesizing voice memory control circuit 19 and then converted to the corresponding digital voice data word (or one digit) by word, by voice synthesizing circuit 21. This digital voice data (non-voice, i.e., synthesized voice) is written word by word from the designated address of recording memory 7 through transfer gate 3B, low-pass filter 4, coding circuit 5, and transfer gate 6A which is open in this case.

That is, in the writing mode of the synthesizing voice data, the control signal "a1" is supplied from the system control circuit 29 to recording memory control circuit 30 and then delivered as the control signal "b" to gate 6A, and also supplied to AND gate 66 via OR gate 64 and mono-multivibrator 65, so that the above head address of address register 67 is preset in RAM address counter 62. As a result, the synthesized voice data is in turn written from this head address in RAM 7. At this time, the synthesized voice data in the areas after the interposing location address of recording memory 7 is sequentially sent and saved into buffer memory 8. After completion of the insertion of the data from keyboard 15, transfer gate 6B is opened and transfer gate 6A is closed. Thus, the synthesized voice data in buffer memory 8 is rewritten into the memory areas after the interposed data in recording memory 7.

The synthesized voice data keyed-in by the key switch terminal 14 and the voice message data acoustic-input by microphone 1, both as stored in RAM 7, will now be reproduced in the following step.

Upon receipt of the coincidence signal "g" from coincidence detecting circuit 50 at the alarm time through system control circuit 29, the recording address control circuit 30 enables RAM address counter 62 to be reset via mono-multivibrator 69 as shown in FIG. 1B. The output signal from OR gate 68 is the control signal "d" for energizing the decoding circuit 10, and also supplied to address control circuit 63. RAM address counter 62 sequentially designates the stored data of RAM 7 from the first address so as to reproduce the voice message data.

When the synthesized voice data is reproduced, the switch terminal 14 is turned on in accordance with a predetermined reproduction operation. Thus, since the control signal "$a_3$" is supplied to recording memory control circuit 30 via system control circuit 29, the output signal of mono-multivibrator 65 causes AND gate 66 to be open so that the head address of address register 67 is preset by RAM address counter 62. Accordingly, the stored data designated by an address succeeding the above preset address will now be reproduced.

SECOND MODE OF ELECTRONIC WRIST WATCH

A second arrangement 200 will be described with reference to FIG. 2.

This second arrangement 200 is summarized as follows. When a specific address of the recording memory is read out, the synthesized voice data such as a telephone number of the like which was preset into the synthesized voice data memory by the operator is read out from this memory and automatically written into the recording memory. In FIG. 2, the same parts and components as those shown in FIG. 1 are designated by the same reference numerals and their descriptions will be omitted.

Figure 2:
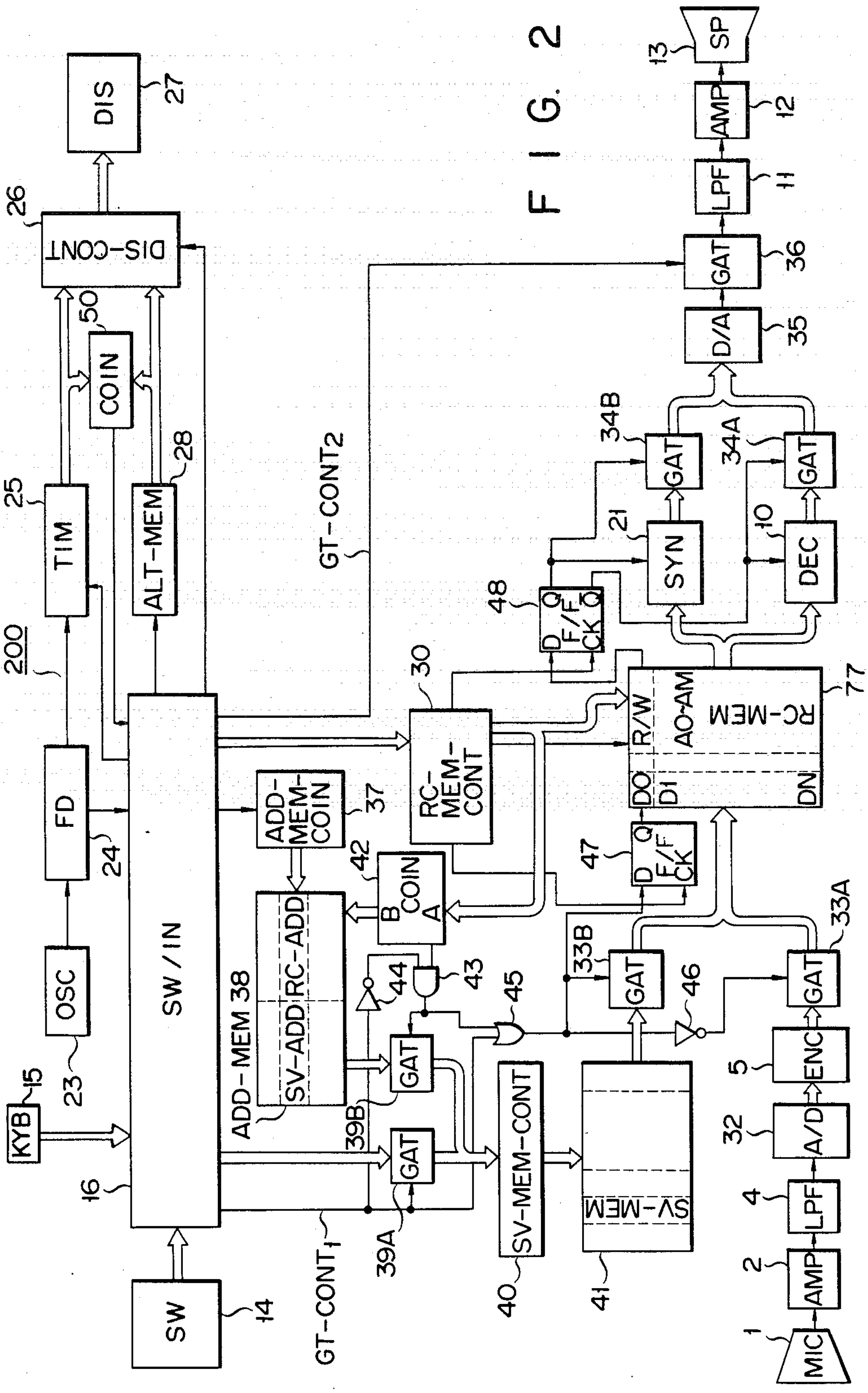
FIG. 2 is a block diagram of an electronic wrist watch employing another recording/reproducing apparatus according to a second preferred embodiment.

In FIG. 2, an A/D converter 32 is provided between low-pass filter 4 and coding circuit 5. The voice message input from microphone 1 is converted to digital data of predetermined bits and then coded by coding circuit 5. This coded data is written into recording memory 77 through a transfer gate 33A. In the case of generating the voice message data in recording memory 77 as a sound from speaker 13, the voice message data is read out from recording memory 77 and input to decoding circuit 10 and decoded. Then, this decoded data is transmitted to a D/A converter 35 through a transfer gate 34A and converted to analog data. This analog data is then transferred through a transfer gate 36, low-pass filter 11, amplifier 12, and speaker 13 and is generated from speaker 13 as a voice, i.e., nonsynthesized voice.

An address memory 38 is constituted by a RAM. A specific or designated address of recording memory 77 and an address of a synthesized voice data memory 41 corresponding to this specific address are written as a pair of address data into address memory 38 by two steps under control of an address memory control circuit 37 which is made operative by a signal of "+1" from switching input circuit 16. In this case, as will be described in detail hereinafter, the voice message data in recording memory 77 is preliminarily reproduced and generated as a sound and the address of recording memory 77 which is being reproduced is checked by display device 27 while the operator is listening to the sound generated. Thus, it is possible to determine which portion of the voice message data in recording memory 77 the synthesized voice data is interposed with.

Next, the necessary data (memorandum data of a telephone number and the like) is input by predetermined switch operations of switch terminal 14 and is sequentially written as the synthesizing voice data into respective addresses in synthesizing voice data memory 41 through switching input circuit 16, a transfer gage 39A, and a synthesizing voice data memory control circuit 40. In this case, the address in synthesizing voice data memory 41 of each synthesized voice data is written as a corresponding address into address memory 38.

Then, the location in recording memory 77 at which each synthesized voice data written into synthesizing voice data memory 41 as described above is written, namely, the specific of deignated address is written as one of the pair of address data into address memory 38 by a predetermined switch operation.

The automatic recording or storing operation of the synthesizing voice data into the specific address in recording memory 77 is then started. In this case, the present address in recording memory 7 is sequentially supplied to A input terminal of a coincidence detection circuit 42 by recording memory control circuit 30. The specific address in recording memory 77 which is sequentially read out from address memory 38 is supplied to B input terminal of coincidence detection circuit 42. Thus, the coincidence discriminating operation is executed. When both of the present address and the specific address coincide, namely, when the specific address in recording memory 77 where the automatic recording or storing operation is performed arrives, a coincidence detection signal of "1" is output to open a transfer gate 39B through an AND gate 43. Further, a transfer gate 33B is opened through an OR gate 45. The "1" signal is also supplied to D input terminal of a D-type flip-flop 47 and its set output is set to "1" after a predetermined time.

The other address in synthesizing voice data memory 41 of the pair address data namely, the specific adress is simultaneously given to synthesizing voice data memory 41 and read out. The synthesizing voice data from synthesizing voice data memory 41 is written into this specific address in recording memory 77. $D_0$ to $D_N$ shown in recording memory 77 indicate flag bits. When the data in each address which is recorded into recording memory 77 is the synthesizing voice data, "1" is written into recording memory 77 and when it is the voice message data, "0" is written into recording memory 77 by a set output of flip-flop 47. Flag bits $D_0$ to $D_N$ are input to a D input terminal of a D-type flip-flop 48 when the data in recording memory 77 is reproduced. Voice synthesizing circit 21 and a transfer gate 34B are driven by a set output of flip-flop 48, so that the synthesizing voice data is reproduced from recording memory 77. On the other hand, decoding circuit 10 and transfer gate 34A are driven by a reset output of flip-flop 48, so that the synthesized voice data is reproduced from recording memory 77.

A gate control signal from switching input circuit 16 is supplied to AND gate 43 through an inverter 44 and drives transfer gate 39A and is further input to OR gate 45. An output of AND gate 43 is input to OR gate 45. An output of OR gate 45 is directly input to transfer gate 33B and is also input through an inverter 46 to transfer gate 33A, thereby driving transfer gates 33B and 33A, respectively.

Further, a control signal of a plurality of bits from switching input circuit 16 is input to recording memory control circuit 30, thereby controlling the operation thereof. In addition to the above-mentioned operations, clock pulses are given to flip-flops 47 and 48 to make them operative. Another gate control signal is directly supplied to transfer gate 36 from switching input circuit 16.

An explanation will then be made with respect to the automatic recording operation of the synthesized voice data into a specific or designated address in recording memory 77 as the major operation in the second mode.

It is now assumed that the voice message data due to a voice from microphone 1 has been previously recorded into recording memory 77. In this case, by setting the recording mode of the voice message data due to a predetermined switch operation of operation switch terminal 14, the gate control signal of "0" is output from switching input circuit 16 to close transfer gate 39A and is also input to OR gate 45. Since the output of AND gate 43 is "0" at this time, the output of OR gate 45 is also "0", so that transfer gate 33A is opened and transfer gate 33B is closed. In addition, since the signal of "0" is input to the D input terminal of flip-flop 47, its set output is always "0".

Therefore, as the voice message is input from microphone 1, the corresponding voice message data is sequentially recorded into recording memory 77 at the addresses designated by the address data from recording memory control circuit 30, through microphone 1, amplifier 2, low-pass filter 4, A/D converter 32, coding circuit 5, and transfer gate 33A. In this case, the flag "0", namely, the flag representative of the voice message data is simultaneously written into respective flag bits $D_O$ to $D_N$ and stored into recording memory 77.

Then, the voice message data previously recorded in recording memory 77 is sequentially reproduced by setting the reproducing mode by a predetermined switch operation of operation switch terminal 14 and the contents are confirmed. Also, a determination is made with regard to the address location in recording memory 77 at which synthesizing voice data is interposed. The results are written on a notebook or the like. In this case, since it is all voice message data that is read out from recording memory 77, the signal "0" is always input to the D input terminal of flip-flop 48 from flag bits $D_0$ to $D_N$, so that the reset output of flip-flop 48 becomes "1", thereby driving decoding circuit 10 and opening transfer gate 34A. Thus, each voice message data from recording memory 77 is sequentially reproduced as a sound by decoding circuit 10, transfer gate 34A, D/A converter 35, transfer gate 36, low-pass filter 11, amplifier 12, and speaker 13.

In this case, the address in recording memory 77 of the voice message data, which is at present being reproduced as a sound, is displayed on display device 27, so that the address can be easily confirmed.

Next, after completion of the confirmation using diaplay device 27 and the memorandum data written on the notebook in this manner, the operation to write the synthesized voice data to be interposed or recorded in the specific or designated address in recording memory 77 into synthesizing voice data memory 41 is executed. In this case, by setting the mode for this writing operation by a predetermined operation of operation switch terminal 14, the gate control signal "1" is outputted from switching input circuit 16, thereby opening transfer gate 39A. When the necessary message such as a telephone number and the like is input by other switch operations, the data is sequentially written as the synthesizing voice data into synthesizing voice data memory 41 through transfer gate 39A and synthesizing voice data memory control circuit 40. At the same time, the addresses of the synthesizing voice data in synthesizing voice data memory 41 are sequentially written in the regions for the synthesizing voice data addresses in address memory 38.

Then, in accordance with the confirmation of the address during reproduction from recording memory 77, it is determined at which location in recording memory 77, the synthesizing voice data preset into synthesizing voice data memory 41 is written in this manner. Even in this case as well, by performing further switch operation, the specific or designated address in recording memory 77 representative of the pair of address data with the address in synthesizing voice data memory 41 of the synthesizing voice data, is written into address memory 38.

The synthesizing voice data preset in synthesizing voice data memory 41 is then interposed in the specific or designated address in recording memory 77 due to the automatic recording or storing operation. In this case, when this recording mode is designated due to an of operation switch terminal 14 different from the above-mentioned operation, a gate control signal of "0" is output, so that transfer gate 39A is closed and AND gate 43 is opened. Coincidence detector circuit 42 discriminates whether or not the present address in recording memory control circuit 30 coincides with the specific address in recording memory 77 read out from address memory 38. When the present address in recording memory 77 coincides with the specific address preset in address memory 38, a coincidence detection signal of "1" is output. Transfer gate 39B is opened by the "1" signal which is simultaneously output from AND gate 43 due to this coincidence detection signal. The address in synthesizing voice data memory 41 which has been preset in address memory 38 and which is the specific address of the pair address data at that time, is given to synthesizing voice data memory 41 through transfer gate 39B and synthesizing voice data memory control circuit 40. The synthesizing voice data in this adress in synthesizing voice data memory 41 is read out and given to transfer gate 33B. At this time, transfer gate 33B is open due to the output "1" of AND gate 43 and the "1" signal is also input to the D input terminal of flip-flop 47 and its set output becomes "1". Thus, the synthesizing voice data read out from synthesizing voice data memory 41 is written into the specific address in recording memory 77. The flag "1" is written in the corresponding ones of flag bits $D_0$ to $D_N$.

After the necessary message has been automatically recorded in arbitrary specific addresses in recording memory 77 in this manner, in order to reproduce the contents, the reproducing mode is set by a predetermined switch operation, so that the data in each address is sequentially read out from recording memory 77. In the case where this data is the voice message data in an address other than the specific address, flag bits ($D_0$ to $D_N$) are "0", so that flip-flop 48 is reset and decoding circuit 10 and transfer gate 34A are driven by this reset output "1". The voice message data is then reproduced as a sound from speaker 13.

On the other hand, when the synthesizing voice data and flag bits ($D_0$ to $D_N$) of "1" are read out from the specific addresses in recording memory 77, voice synthesizing circuit 21 and transfer gate 34B are driven by the set output "1" of flip-flop 48. As a result, the synthesized voice based on the synthesizing voice data in the specific addresses is reproduced and generated as a sound from speaker 13.

In the electronic wrist watches in the first and second modes described in detail above, in order to inform an operator of the characters, numerals, words, data, etc. keyed-in by a voice upon reproduction, this input data is previously subjected to a voice synthesizing process and thereafter it is stored into the recording memory. Alternatively, for the same purposes, this input data is stored into the recording memory as synthesizing input data and thereafter synthesized before reproduction. However, instead of performing the previous voice synthesizing process, the input data may be recorded into the recording memory in an input digital data form and may be read out from this memory upon reproduction. The synthesized voice data is produced by this data and, thereafter, the synthesized voice data may be generated as a sound from the speaker.

In addition, the input data stored into the recording memory as the input digital data, as mentioned above, may upon reproduction be merely read out and displayed on the display device. In this case, the voice synthesizing circuit and peripheral circuits can be omitted.

Further, in the second mode, after the voice message data has been previously stored into the recording memory, the synthesized voice data is automatically interposed. However, the synthesized voice data may be first recorded into the recording memory and thereafter the necessary voice message data may be automatically interposed.

THIRD MODE OF ELECTRONIC WRIST WATCH

Figure 3:
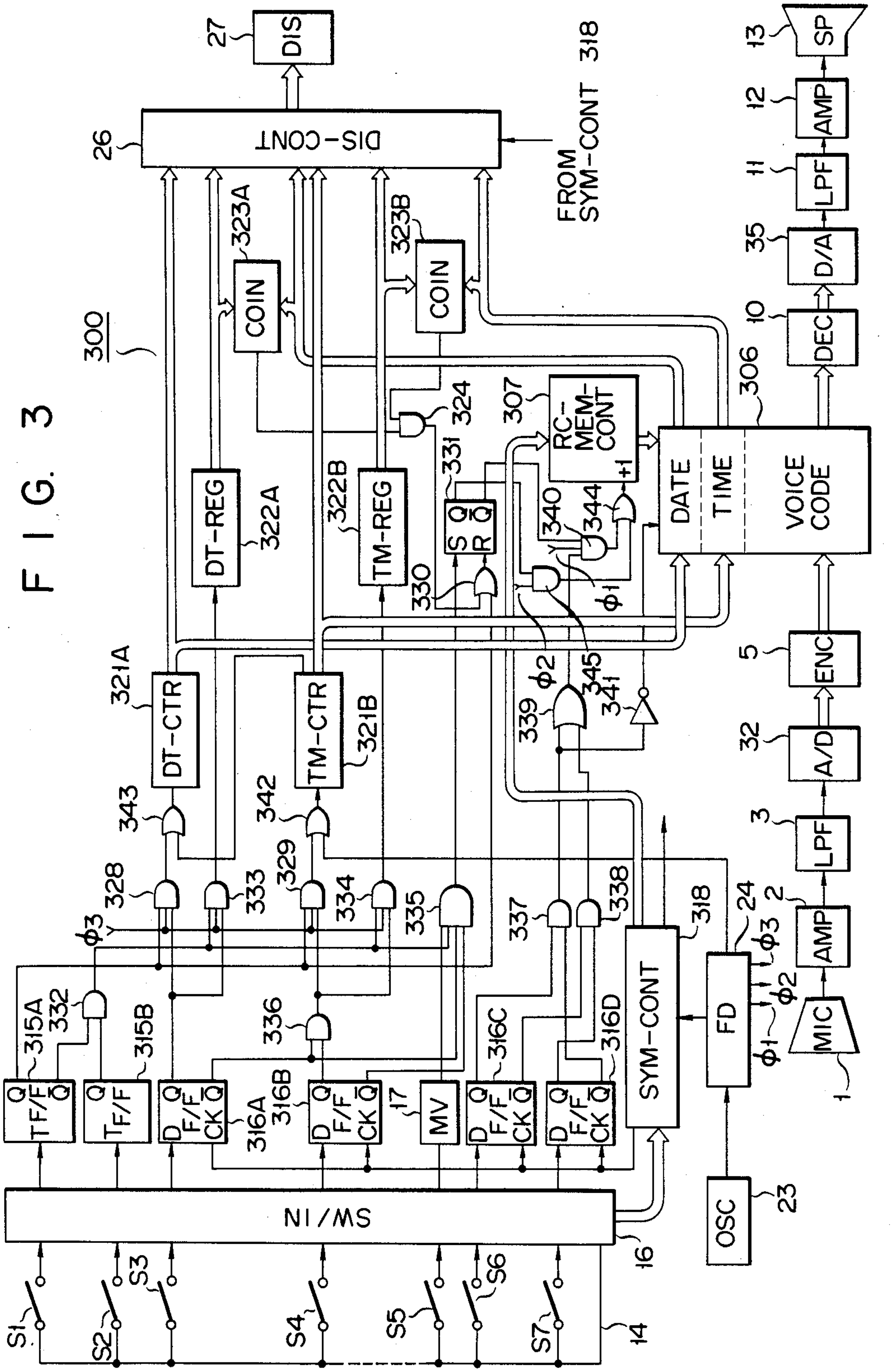
FIG. 3 is a block diagram of an electronic wrist watch employing other recording/reproducing apparatus according to a third preferred embodiment.

Referring now to FIG. 3, a third arrangement 300 according to the invention will be described.

In FIG. 3, the same or similar circuit elements as those used in the first and second arrangements 100 and 200 shown in FIGS. 1 and 2 are designated by the same reference numerals.

The third arrangement is summarized as follows. In recording operation, the time data such as date, time, or the like which is generated by the timer circuit is automatically stored in a storage region different from the voice message data storage region in the RAM in which the voice message data is stored. Next, by designating the date, time, or the like by the keyboard, the storage content on the date or at the time designated can be reproduced.

In FIG. 3, the voice message data which is input from microphone 1 is supplied to coding circuit 5 through amplifier 2, a low-pass filter (LPF) 3, and A/D converter 32 and converted to a digital voice message code. Together with the date data and time data from a date counter 321A and time counter 321B constituting a timer circuit, the digital voice message code is written into a RAM (random access memory) 306 having the memory capacity of twenty pages. The digital voice message code is processed by the PCM (pulse code modulation) system. The memory capacity of RAM 306 is 256 kilobits.

When a set of voice message code and date and time data in RAM 306 are designated and read out, this data is decoded by decoding circuit 10 and transmitted through D/A converter 35, low-pass filter 11, amplifier 12, and speaker 13 and is generated as a voice sound. At the same time this data is displayed on display device 27 through display control circuit 26.

Operation switch terminal 14 includes switches $S_1$ to $S_7$. The outputs of switches $S_1$ and $S_2$ are respectively input to T input terminals of T-type flip-flops (FF) 315A and 315B corresponding to these switches through switching input circuit 16. The outputs of switches $S_3$, $S_4$, $S_6$ and $S_7$ are respectively input to D input terminals of corresponding D-type flip-flops 316A, 316B, 316C, and 316D through switching input circuit 16. Further, an output of switch S5 is input to a one-shot multivibrator 317 through switching input circuit 16.

Switches $S_1$ to $S_7$ are respectively: the set mode switch of date, time, and voice message code; the search mode switch of date, time, and voice message code; the switch of plus one day; the switch of plus one minute; the search switch; the recording mode switch; and the reproducing mode switch.

Further, each switch output is also input to a system control circuit 318 from switching input circuit 16. The control data based on this switch output is given to a recording memory control circuit 307. The writing and readout operations of the data into and from RAM 306 are performed under control of recording memory control circuit 307.

A set output (set mode signal) of flip-flop 315A is input to AND gates 328 and 329 and a reset input terminal R of an SR-type flip-flop 331 through an OR gate 330. A reset output of flip-flop 315A is input to AND gate 332 together with a set output of flip-flop 315B and becomes a search mode signal. This search mode signal is input to AND gates 333, 334, and 335.

A set output of a flip-flop 316A is input to AND gates 328 and 333 and a reset output is input to AND gates 336 and 335. A set output of a flip-flop 316B is input to AND gate 336. An output of AND gate 336 is further input to AND gates 329 and 334. The reset output of flip-flop 316B is also input to AND gate 335. An output of AND gate 335 is input as a search date/time signal to a set input terminal S of flip-flop 331.

One output signal from one-shot multivibrator 317 is input to AND gate 335.

A set output of a flip-flop 316C and a reset output of a flip-flop 316D are input to an AND gate 337. An output of AND gate 337 is input as a recording mode signal to an AND gate 340 through an OR gate 339 and also input to an R/W terminal of RAM 306 through an inverter 341. A reset output of flip-flop 316C and a set output of flip-flop 316D are input to an AND gate 338. An output of AND gate 338 is input as a reproducing mode signal to AND gate 340 through OR gate 339.

Oscillator 23 generates a reference signal and supplies this signal to frequency dividing circuit 24, thereby allowing a one-second signal and clock signals $\phi_1$, $\phi_2$, and $\phi_3$ to be generated. Frequency dividing circuit 24 also generates another timing signal to system control circuit 318, so that system control circuit 318 sets the address data to recording memory control circuit 307.

On one hand, the one-second signal is input to an OR gate 342 together with a plus one-minute signal as an output of AND gate 329 and is given to time counter 321B through AND gate 329 and counted by time counter 321B to produce the time data. This time data is supplied to display device 27 through display control circuit 26 and displayed. A carry signal CRY of time counter 321B is input to an OR gate 343 together with a plus one-day signal as an output of AND gate 328 and is given to date counter 321A through OR gate 343 and counted by date counter 321A. The date data is sent to display device 27 through display control circuit 26 and displayed.

An output of AND gate 333 is input to a date register 322A for search and thereafter it is input to a coincidence circuit 323A together with the date data from RAM 306. The output of date register 322A is also sent to display device 27 through display control circuit 26 and displayed. An output of AND gate 334 is input to a time register 322B for search and thereafter it is input to a coincidence circuit 323B together with the time data from RAM 306. An output of time register 322B is supplied to display device 27 through display control circuit 26 and displayed. Both coincidence detection signals of coincidence circuits 323A and 323B are input to an AND gate 324. An output of AND gate 324 is input to a reset input terminal R of flip-flop 331 through OR gate 330. A reset output of flip-flop 331 is inputted to AND gate 340 together with clock signal $\phi_1$. An output of AND gate 340 is input to a +1 input terminal of recording memory control circuit 307 through an OR gate 344. A set output of flip-flop 331 is input to an AND gate 345 together with clock signal $\phi_2$. An output of AND gate 345 is input to OR gate 344. Clock signal $\phi_3$ is input to AND gates 328, 333, 329, and 334.

Figure 4:
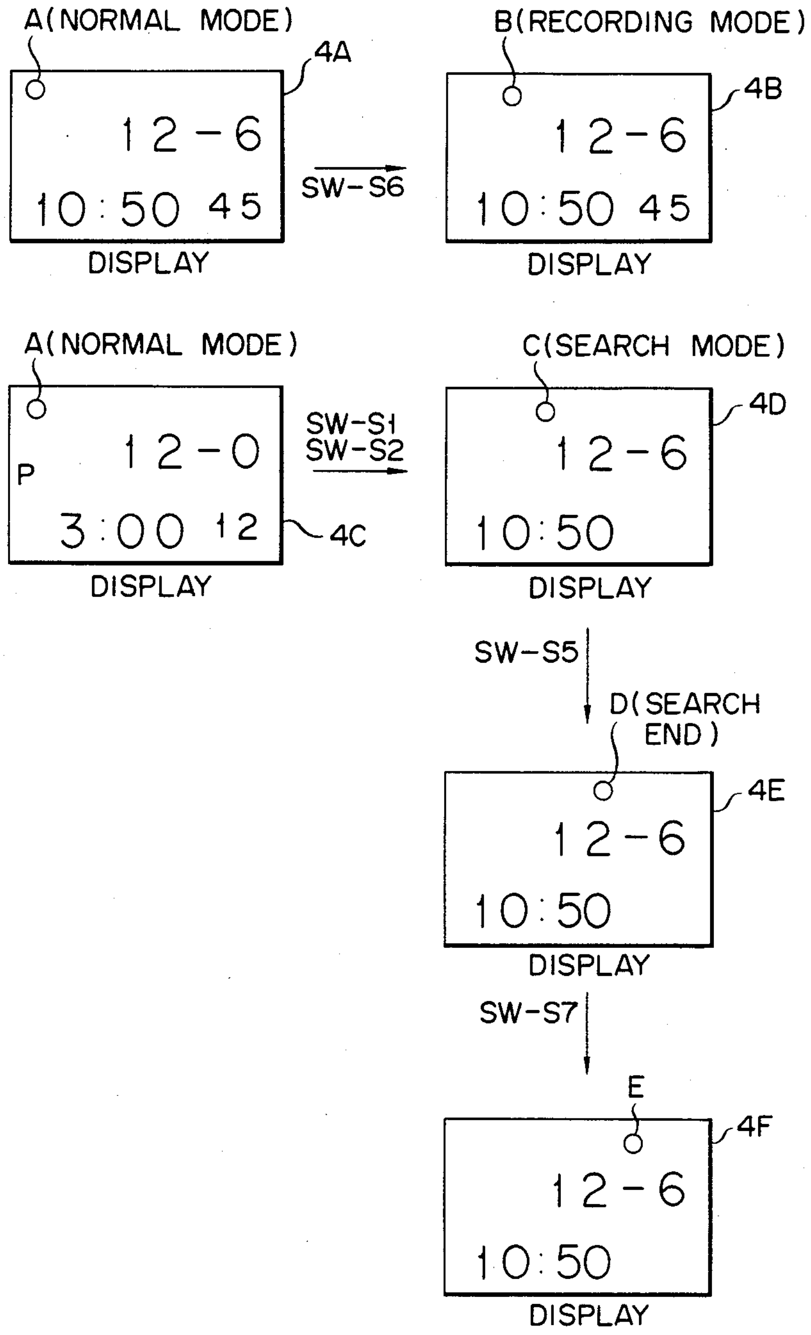
FIGS. 4A to 4B show various display modes of the display device of the electronic wrist watch shown in FIG. 3.

The operation will then be described with reference to FIGS. 3 and 4.

Oscillator 23 always generates a reference signal to frequency dividing circuit 24, whereby circuit 24 generates a one-second signal, clock signals $\phi_1$, $\phi_2$, and $\phi_3$, and various kinds of timing signals to be generated. These signals are supplied to time counter 321B, AND gates 340 and 345, AND gates 328, 329, 333, and 334, and system control circuit 318, respectively.

Time counter 321B counts the one-second signal to obtain the time data and supplies this time data to display device 27 through display control circuit 26. The time data is also supplied to RAM 306. Further, carry signal CRY is supplied to date counter 321A and counted, thus providing the date data. This date data is supplied to display device 27 and RAM 306. Thus, the date and time are displayed in the normal mode as shown in FIG. 4A. A denotes, a lighting mark "A" indicative of the normal mode.

It will be described how to preset the date data, time data, and voice message code to RAM 306. First, switch $S_1$ is operated, setting flip-flop 315A. The AND gates 328 and 329 are opened by the set mode signal "1". Flip-flop 331 is reset thereby opening AND gate 345 and recording memory control circuit 307 is increased by +1 for every output of clock signal $\phi_2$, thereby designating the address in RAM 306.

Next, switch $S_6$ is operated, setting flip-flop 316C. A "0" signal (writing command) is input to the R/W input terminal of RAM 306 by the "1" output of AND gate 337.

When the necessary message is input from microphone 1 and recorded, the voice message code is written into the specified or designated address in RAM 306 as a set of data together with the present date and time data from date counter 321A and time counter 321B due to the operations of voice processing circuitries 1 to 5 and 32.

FIG. 4B shows a display mode when switch $S_6$ is turned on. In this mode, the latest time and date are displayed and a lighting mark (recording mode) of "B" is shown.

FIG. 4C shows the same display mode as the normal mode of FIG. 4A. In this mode, switches $S_1$ and $S_6$ are turned on to set the recording mode. Thereafter, switches $S_3$ and $S_4$ are turned on to set flip-flops 316A and 316B. Therefore, there is shown the example whereby the message is recorded from microphone 1 when the present date and time of FIG. 4C in date counter 321A and time counter 321B are corrected to the date and time of FIG. 4D for every output of clock signal $\phi_3$.

On the other hand, to reproduce the content stored in RAM 306, switch $S_2$ is turned on to set flip-flop 315B and the search mode signal is set to "1", thereby opening AND gates 333, 334, and 335.

In addition, switches $S_5$ and $S_7$ are turned on and flip-flop 331 is set by the "1" output of AND gate 335 by the one shot signal of one-shot multivibrator 317. Thus, AND gate 345 is opened and the address in RAM 306 is designated for every output of clock signal $\phi_2$. Further, flip-flop 316D is set and the output of AND gate 318 becomes "1", so that AND gate 340 is also opened. The "1" output (readout command) of inverter 341 is supplied to RAM 306.

Therefore, the date data and time data which are sequentially read out from RAM 306 are sent to display device 27 and displayed. The voice message code which constitutes the pair message data together with those data is reproduced by reproducing circuitries 8 to 12 and generated as a voice. FIG. 4D shows a display mode when the search mode is set. In this mode, the present time and date are displayed and a lighting mark "C" in the search mode is shown. FIG. 4E shows a display mode of the content searched and a search completion mark (lighting mark of "D"). Further, FIG. 4F shows a display mode of the time and date which are being searched and a lighting mark "E" indicating that the search is being performed.

When switch $S_3$ or $S_4$ turned on in the search mode, flip-flop 316A or 316B is set, thus opening AND gates 333 and 334. When the date and time data set in date register 322A and time register 322B (these data are displayed by display device 27) coincide with the date data and time data read out from RAM 306, these date data and time data are read out by clock signal $\phi_3$. The "1" signals are output from coincidence circuits 323A and 323B and the output of AND gate 324 becomes "1". Thus, when flip-flop 331 is reset, the voice message code at that time is generated as a sound.

The coding method of coding circuit 5 may be selected from the DM (delta modulation system), ADM (adaptive delta modulation system), DPCM (differential pulse code modulation system, ADPCM (adaptive differential pulse code modulation system), or PARCOR.

The memory capacity of RAM 306 may be selected to be one megabits or 32 kilobits consisting of two 16-kbit memories.

The invention may be also applied to small electronic appliances other than electronic watches.

As described above, according to the third mode, the time data of the timer circuit and the data recorded by the recording microphone or the like are combined as a set and stored in the same RAM. The time is designated, read out and reproduced and, generated as a sound by the recording/reproducing apparatus. Therefore, the following advantages are presented.

(1) Since the date and time when the recording is performed are automatically stored in a memory, the date and time of the content (voice) recorded can be accurately known. Therefore, there is no need to separately write down on a notebook or the like, nor to memorize them. It is possible to eliminate anxiety over whether such dates and times are forgotten, the memorandum is lost, or the correspondence relation between the content and the record becomes obscure. (2) Even in the case of searching for a desired data from a large amount of recorded data as well, it can be searched for by selecting date and time, so that there is no need to reproduce all data to search for the desired data nor to refer to a memorandum. This results in an improvement in the search efficiency.

(3) By merely recording the present location, contents of business negotiations, promises, and the like at that location, and thereafter by merely searching and reproducing necessary data using the date and time (since the date and time when the recording was performed are automatically stored according to the present invention), the necessary data can be easily reproduced. Consequently, this apparatus can be used to record the transaction data, consultant time, or the like by salesmen, lawyers, consultants. Further, this apparatus can be used as a diary, a temporary memorandum, or the like. Consequently, a new and convenient use application can be realized.

(4) In an electronic watch, an existing register for a timer or calendar system, built in the watch, can be used in the recording function. Thus, the abovementioned effects can be realized without largely increasing the circuits required and cost.

MODIFICATION OF STORAGE DEVICE

In the first to third modes explained above, the RAM to record the voice message data was provided in the electronic wrist watch. However, according to the invention, only a portion of the RAM may be attached to a card and be used independently of the appliance. A modification of the RAM will be described in detail hereinbelow with reference to the drawings.

Figures 5A, 5B, 5C:
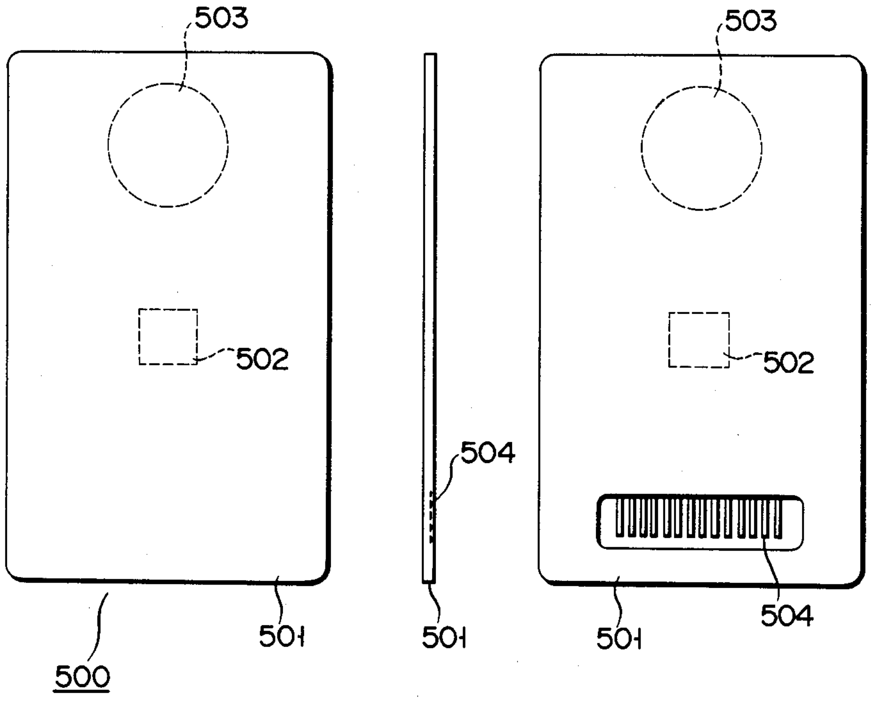
FIGS. 5A to 5C show an electronic recording card used in combination with the recording/reproducing apparatus according to the invention.

FIG. 5A is a front view of an electronic recording card 500, FIG. 5B is a side view thereof, and FIG. 5C is a rear view thereof. In the diagrams, a card body 501 is a rectangular thin plate. The dimensions of card body 501 are set to, for example, 85.47 to 85.72 mm in longitudinal length, 53.92 to 54.03 mm in lateral width, and $0.76\pm0.08$ mm in thickness. Namely, this card body is formed in conformity with the ISO (International Standard Organization) standard rule similarly to bank cards, credit cards, or the like. A recording memory 502, a small-sized battery 503, and the like which are formed like thin plates are built in card body 501. A connecting terminal 504 is arranged in the lower portion of the back surface of card body 501. This connecting terminal 504 is exposed from card body 501 and connected to an electronic watch body (not shown in detail) having a recording function which can control the recording and reproducing operations.

Figure 6:
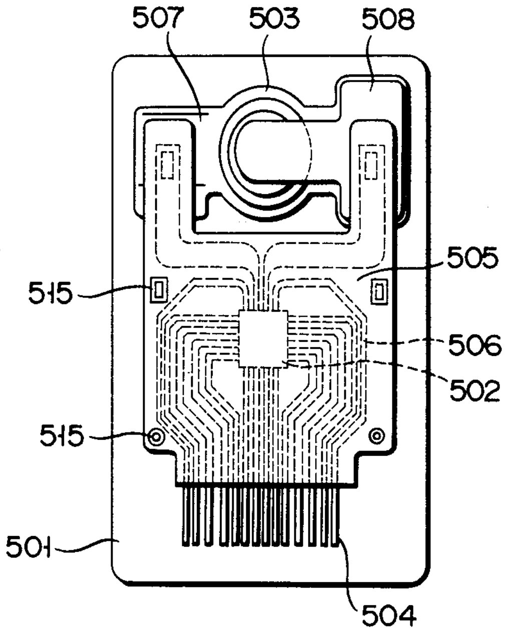
FIG. 6 shows an inside view of the electronic recording card shown in FIG. 5.

FIG. 6 shows an internal structure of electronic recording card 500 and illustrates the state in that the rear casing (not shown in detail) constituting card body 501 was removed. A thin circuit substrate 505 is arranged in card body 501. Recording memory 502 is mounted in the central portion of the front surface of circuit substrate 505. Also, a conductor 506 led out from recording memory 502 is formed on this front surface. Circuit substrate 505 is fixed by screws which are screwed and fastened into substrate mounting bores 515 formed at proper positions. Connecting terminal 504 is provided at the lower end of circuit substrate 505. This connecting terminal 504 is connected to recording memory 502 through conductor 506. Further, a pair of battery supporting plates 507 and 508 are attached to the upper end portions of circuit substrate 505 and battery 503 is supported between these plates. Battery supporting plate 507 also serves as a positive electrode plate and battery supporting plate 508 also serves as a negative electrode plate. Battery 503 and recording memory 502 are connected through battery supporting plates 507 and 508, and conductor 506.

Figures 7A, 7B, 7C:
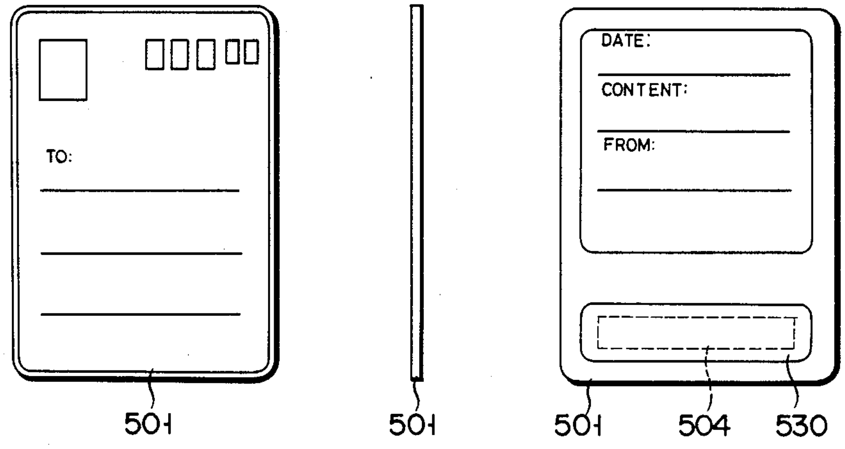
FIGS. 7A to 7C show a postal card type electronic recording card.
Figure 8:
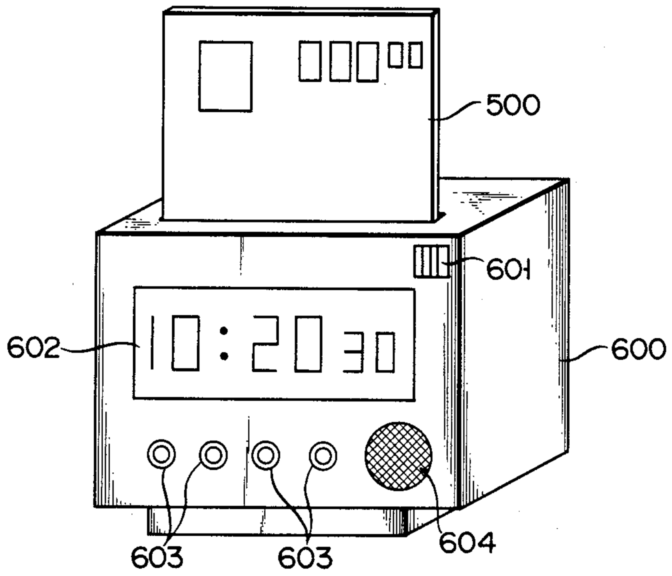
FIG. 8 is a perspective view of a clock employing a recording/reproducing apparatus according to the invention.

In this embodiment, the recording memory is provided in the electronic recording card independently of the recording/reproducing apparatus (e.g., electronic watch). Data can be directly recorded in this card. Therefore, the electronic recording card can be detached from the recording/reproducing apparatus. Thus, this electronic recording card can be effectively used as communicating or information transmitting means as will be explained hereinbelow. For example, in the case where the electronic recording card is directly sent to the other person or, contrarily, the data input by the other person is reproduced from the electronic recording card, information can be transmitted between the user and the other person using this card as a medium. In this case, since the electronic recording card has the size of postal card, this card can be mailed by adhering a stamp thereon. Namely, for example, as shown in FIGS. 7A to 7C, the postal code column and the underlines to write the names and addresses of the receiver and sender, or the like may be preliminarily printed on the front surface of the card, while the column to write the date, table of contents recorded, or the like may be preliminarily printed on the back surface of the card. By constituting the electronic recording card in this manner, this card will become more convenient. Particularly, it is convenient to detachably provide a protection member 530 such as an adhesive seal, cover, or the like for connecting terminal 504 on the rear surface of the card. FIG. 8 illustrates a state in which an electronic recording card 500 the size of a postal card is inserted into a clock 600 having the present recording function. Due to this, the recording and reproducing operations can be performed in and from electronic recording card 500 of the postal card size. A microphone 601, a display panel 602, operation switches 603, and a speaker 604 are attached to the front panel of clock 600.

If the electronic recording card is formed to the size of a cash card or credit card as in the foregoing embodiments, this card can be used as not only simple personal communicating means but also a remarkably convenient card which makes it possible to transmit and receive data by voice, by connecting the card to terminal equipment installed in companies or a public organization.

Further, there is no need to provide a recording memory for the recording/reproducing peripheral apparatuses, so that recording/reproducing peripheral apparatus of a practical and portable size can be realized. Consequently, data can be recorded and reproduced at any time and any place and the card can be used in a wider application range.

FOURTH MODE OF ELECTRONIC WRIST WATCH

FIGS. 9 to 12 show the fourth mode of the present invention.

Figure 9A:
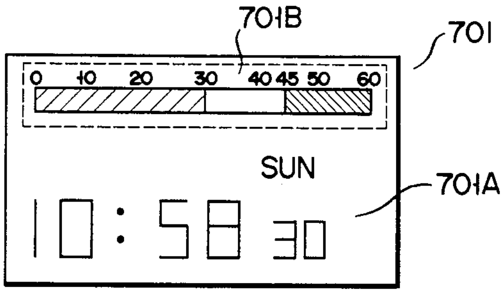
FIGS. 9A and 9B show display panels of an electronic wrist watch according to another embodiment.
Figure 9B:
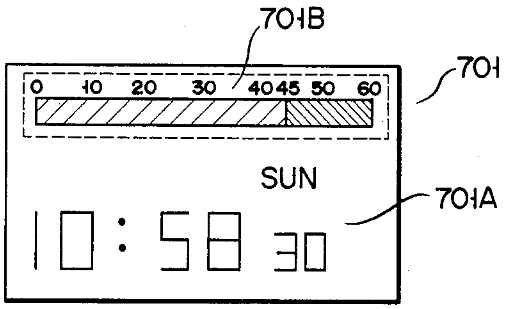

FIGS. 9A and 9B are diagrams showing display conditions of a display section of the electronic wrist watch. In the diagrams, a display section 701 of the electronic wrist watch is constituted by a liquid crystal display device. This display section is provided with a time display section 701A in which the date, the day of the week and the time are displayed by an address data display section 701B. A voice message recording storage unit (RAM), which will be explained hereinafter, is provided in the electronic wrist watch. Address data stored in this RAM is displayed in address data display section 701B. In addition, addresses in the RAM are divided into 0 to 60 parts and displayed in address data display section 701B. When voice message data or the like (data such as a telephone number as well as voice message data) is written into the RAM, the addresses in the RAM where the voice message data was written are displayed. For example, FIG. 9A shows the display condition such that the full memory capacity of the voice message data assumes 60 and the voice message data is stored in half the addresses 0 to 30, and the data such as the name and telephone number is stored in addresses 45 to 60 in the RAM and no data is stored in addresses 30 to 45. FIG. 9B shows the display condition such that the voice message data is stored in addresses 0 to 45 in the RAM and the data such as the addresses and telephone numbers of other persons is stored in addresses 45 to 60 in the RAM.

Figure 10:
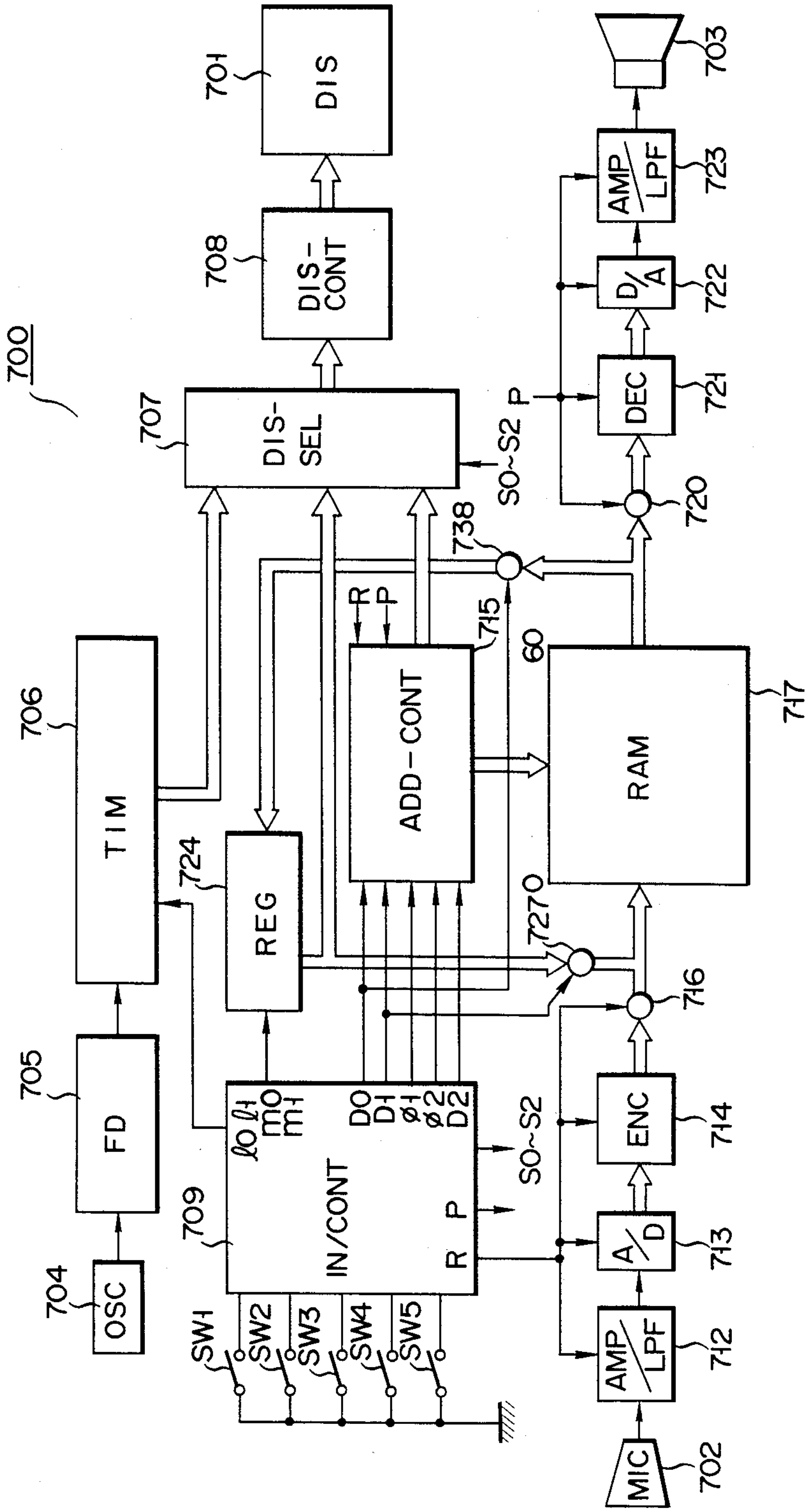
FIG. 10 is a block diagram of an electronic wrist watch according to another embodiment.

The electronic wrist watch having such display section 701 has therein an electronic circuit 700 as shown in FIG. 10.

In FIG. 10, switches $SW_1$ to $SW_5$ are external operation switches provided at positions (not shown) of the electronic wrist watch. As will be explained in detail hereinafter, by operating an arbitrary combination of these switches $SW_1$ to $SW_5$, the correction of the time and the recording (storage) and reproduction (readout) of the voice message data, telephone numbers, or the like can be instructed. A microphone 702 and a speaker 703 are also provided at positions (not shown) in the electronic wrist watch.

In general, to display the time, a high frequency signal of an oscillator 704 constituted by a crystal oscillator is output to a frequency dividing circuit 705. This circuit 705 frequency-divides the high frequency signal into a signal of 1 Hz which is output to a time counting circuit 706. The time counting circuit 706 converts the 1 Hz signal into a time displaying signal of second, minute, hour, or the like and outputs this signal to a display selector 707. When a time mode signal $S_0$ is input, which will be explained hereinafter, it selects this time displaying signal. Time display section 701A of display section 701 displays the time under the control of a display control unit 708.

Figure 11:
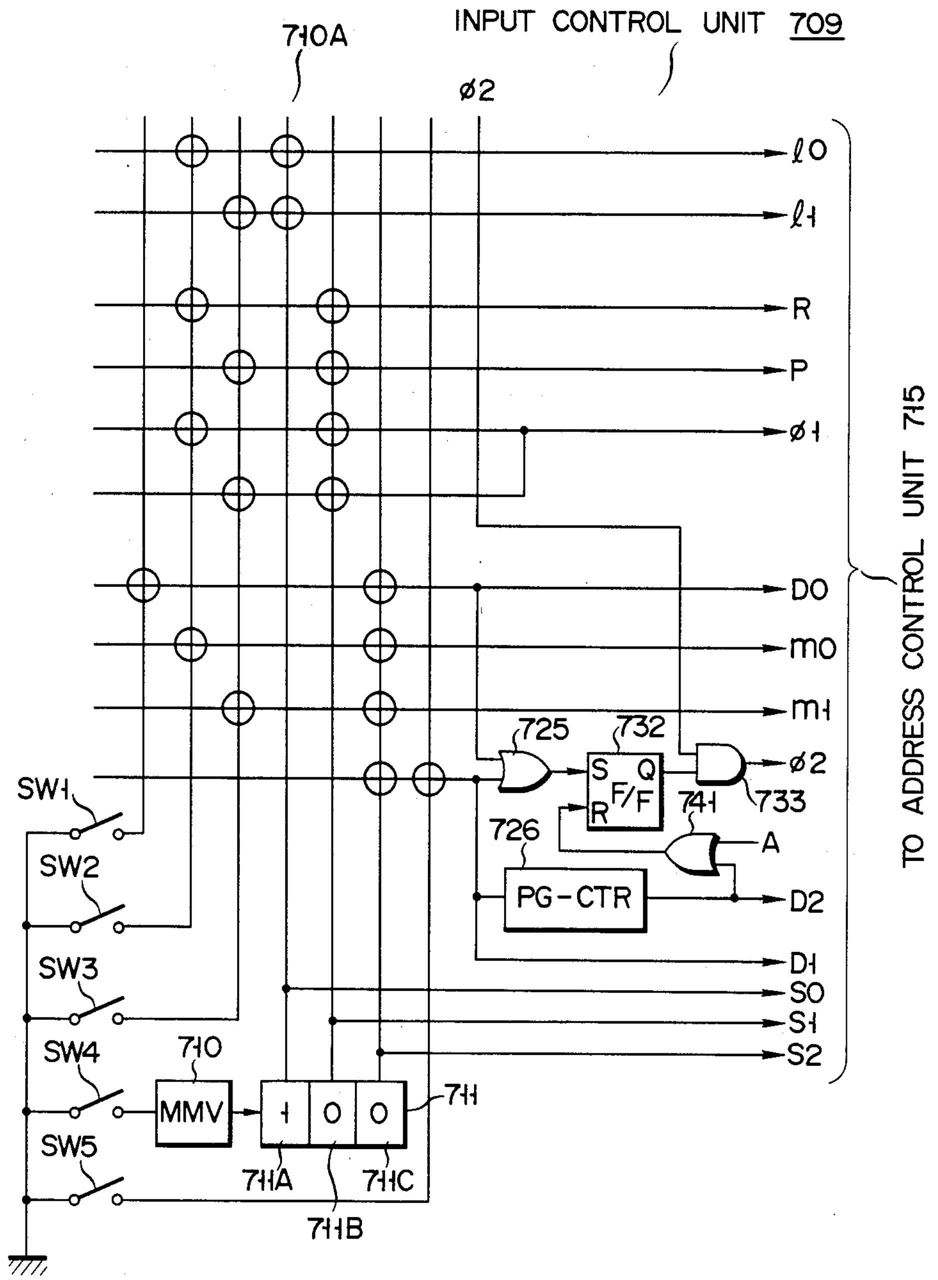
FIG. 11 is a circuit diagram of the input control unit in FIG. 10.

To correct the time displayed in time display section 701A, switches $SW_2$, $SW_3$ and $SW_4$ are operated and a command signal is output to an input control unit 709. Input control unit 709 is constructed as shown in FIG. 11. For example, when switch $SW_4$ is operated, a pulse signal is output to a ring-like shift register 711 through a one-shot or mono-multivibrator 710. Shift register 711 has three areas: a bit area 711A for the time mode; a bit area 711B for the recording/reproducing mode; and a bit area 711C for the writing/readout mode. Every time the pulse signal is input, a logic "1" is sequentially moved in shift register 711. At the same time, time mode signal $S_0$, a recording/reproducing mode signal $S_1$, and a writing/readout mode signal $S_2$ are output to display selector 707. Therefore, to correct the time, logic "1" is set into bit area 711A for the time mode in shift register 711 and switches $SW_2$ and $SW_3$ are operated, so that correction signals $l_0$ and $l_1$ are output to time counting circuit 706 from a decoding unit 710A. If correction signal $l_0$ is used to select the digits upon correction of the time and if correction signal l1 is used for the actual time correction, it is possible to select the correction digit by operating switch $SW_2$ and to correct the time of the selected digit by operating switch $SW_3$.

In order to record the voice message data input from microphone 702 of FIG. 10, switch $SW_4$ is operated and logic "1" is set into bit area 711B for the recording/reproducing mode in shift register 711. Then, as switch $SW_2$ is operated, a recording signal R is output from input control unit 70 to a low-pass filter 712 also serving as an amplifier, an analog/digital converter (hereinafter, referred to as an A/D converter) 713, an encoding circuit 714, and a gate 716. In addition, operating the switch $SW_2$, a $\phi_1$ signal (sampling signal) is also output to an address control unit 715 from input control unit 709. It should be noted that as easily seen from FIG. 2, the function of the circuitry from microphone 702 to the encoding circuit 714 is the same as that of FIG. 2.

When recording signal R is input, amplifier/low-pass filter 712, A/D converter 713 and encoding circuit 714 enter the recording mode, and gate 716 is opened.

When the voice message data is output from microphone 702 to amplifier/low-pass filter 712, amplifier/low-pass filter 712 removes the high frequency component of the voice message data on the basis of a predetermined cut-off frequency and amplifies the voice message data and outputs to A/D converter 713. A/D converter 713 samples the input voice message data at the timing of $\phi_1$ signal. The voltage value of the voice message data sampled in this manner is digitized and output through the encoding circuit 714 and gate 716 to a RAM 717.

Figure 12:
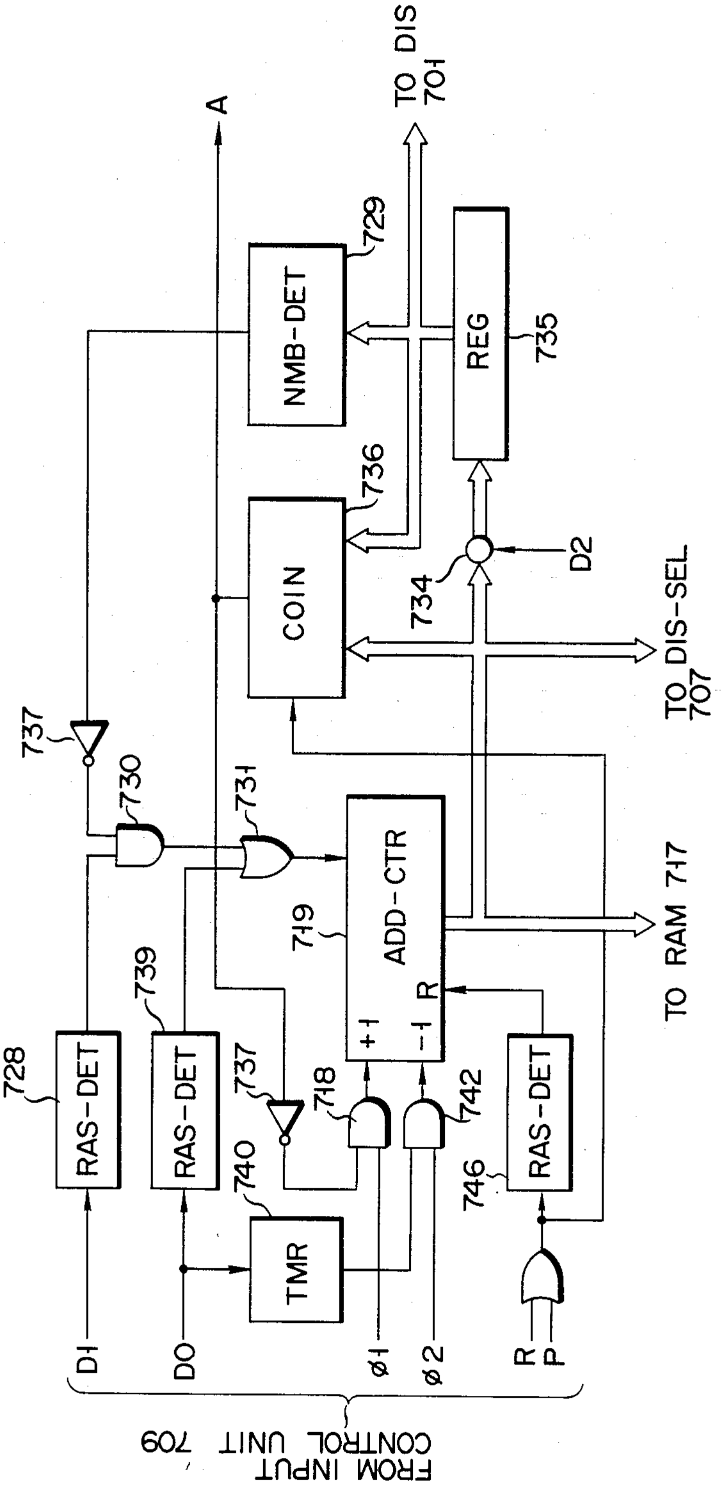
FIG. 12 is a block diagram of the address control unit in FIG. 10.

In addition, $\phi_1$ signal input to address control unit 715 is input to a +1 terminal of an address counter through an AND gate 718 shown in FIG. 12 (practical circuit diagram of address control unit 715) when a coincidence signal, which will be explained hereinafter, is not output, so that the address value of an address counter 719 is sequentially counted up. The count-up data of address counter 719 is output to RAM 717 from address control unit 715. The digital data (voice message data) which is input to RAM 717 is sequentially written (recorded) from address 0 in RAM 717.

The address data which is sequentially increased is also output to display selector 707 from address counter 719 (address control unit 715). Since recording/reproducing mode signal $S_1$ is input to display selector 707, the address data input is output to display section 701 through display cntrol unit 708 and the addresses of the voice message data are displayed in address data display section 701B shown in FIGS. 9A and 9B.

When reproducing the voice message data recorded in this manner, switch $SW_3$ is operated with switch $SW_4$ held as it is (namely, in the state in which logic "1" is set into bit area 711B for the recording/reproducing mode). By operating switch $SW_3$, a reproduced signal P and $\phi_1$ signal are outputted from input control unit 709 as shown in FIG. 11. Reproduced signal P output from input control unit 709 is input to a gate 720, a decoding circuit 721, a digital/analog converter (hereinafter, referred to as a D/A converter) 722, and a low-pass filter 723 also serving as an amplifier. Thus, decoding circuit 721, D/A converter 722, and amplifier/low-pass filter 723 enter the reproducing mode and gate 720 is opened.

A $\phi_1$ signal is input to the +1 terminal of address counter 719 in address control unit 715 through AND gate 718 until a coincidence signal, which will be explained hereinafter, is output. In response to this $\phi_1$ signal input, address counter 719 sequentially counts up the address value of RAM 717 from 0. At this time, since gate 720 has already been open as mentioned above, the voice message data in RAM 717 is sequentially read out from address 0 and input to decoding circuit 721. Decoding circuit 721 decodes the voice message data input and outputs to D/A converter 722.

D/A converter 722 converts the sequentially input data to an analog signal, which is supplied to amplifier/low-pass filter 723. Amplifier/low-pass filter 723 sufficiently amplifies the analog signal (voice message data) input to a voltage value necessary to make speaker 703 operative and thereafter outputs the voice message data to speaker 703. Speaker 703 generates the input voice message data (signal) to the outside as a sound.

A function to store or read out the name and telephone number of is person into or from RAM 717 (hereinafter, this function is referred to as a data bank function) will then be explained.

First, switch $SW_4$ is operated and logic "1" is set into bit area 711C for the writing/readout mode in shift register 711. Next, switches $SW_2$ and $SW_3$ are operated and a digit selection signal $m_0$ and a setting signal $m_1$ are output to a storage register 724 from input control unit 709. Digits of storage register 724 are selected in response to digit selecting signal $m_0$ input. Further, when setting signal $m_1$ is input, the name and telephone number to be stored are input to the selected digits through a bus line (not shown). By sequentially operating switches $SW_2$ and $SW_3$, the name and telephone number are stored in the respective digits of temporary storage register 724.

Switch $SW_5$ is operated when the name and telephone number temporarily stored in storage register 724 in this way are written into RAM 717. When switch $SW_5$ is operated, a signal is output to an OR gate 725 and a one-page counter 726 in input control unit 709. At the same time, signal $D_1$ is output from input control unit 709 to a gate 727 and address control unit 715. When signal $D_1$ is input to gate 727, gate 727 is opened and the name and telephone number data in temporary storage register 724 is output to RAM 717. In addition, signal $D_1$ input to address control unit 715 is input to a leading edge detecting circuit 728 to detect the leading edge of signal $D_1$. After the leading edge of signal $D_1$ is detected by leading edge detecting circuit 728, an output of leading edge detecting circuit 728 is input to address counter 719 through an AND gate 730 and an OR gate 731 when no output is generated from a number detecting circuit 729, which will be explained hereinafter. In address counter 719, the count value of the counter is preset to the last address, namely, "1" is preset to all bits in response to the input signal from leading edge detecting circuit 728. Namely, the address in address counter 719 is set to the last address in response to the leading edge of signal $D_1$. In addition, on the basis of the signal input to OR gate 725 in FIG. 11, a set-reset type flip-flop (hereinafter, referrred to as an SR-type FF) 732 is set. Thus a signal is output from an output Q to an AND gate 733 and a $\phi_2$ signal is input to a $-1$ terminal of address counter 719 through AND gates 733 and 742. Address counter 719 sequentially counts down the count value from the last address in response to the $\phi_2$ signal input. The name and telephone number data which has temporarily been stored in temporary storage register 724 is written into RAM 717. Therefore, the name and telephone number data is sequentially written from the last address into RAM 717.

While the data is being written into RAM 717 as explained above, one-page counter 726 continues the count-up operation. One-page counter 726 has the corresponding count value when the number of digits of, for example, the name and telephone number of one person are written into the RAM and has the same capacity as that of the storage register. When one-page counter 726 has counted up, SR-type FF 732 is reset by a signal $D_2$ which is input through an OR gate 741 and the count-down operation of address counter 719 is stopped. Due to this operation, for example, the name and telephone number of one person are stored into RAM 717. The address values in RAM 717 storing the name and telephone number of one person are stored as the address data into a storage circuit 735 from address counter 719 through an AND gate 734 opened by signal $D_2$. Further, the address values are displayed by address data display section 701B, after being supplied to section 701B through display selector 707 and display control unit 708 to which writing/readout mode signal $S_2$ was input.

The count value (address values of the name and telephone number of one person stored in RAM 717) of address counter 719 stored in temporary storage circuit 735 is also output to a coincidence detecting circuit 736. Coincidence detecting circuit 736 detects whether those address values coincide with the address values of the voice message data which are input from address counter 719 and which are sequentially stored from address 0 in RAM 717. Namely, a check is made to see if the data (voice message data and the name and telephone number data) has been stored in all memory areas in RAM 717 or not. When they coincide, a coincidence detection signal is output from coincidence detecting circuit 736 to AND gate 718 through an inverter 737. When the voice message data is stored into RAM 717, $\phi_1$ signal which is output from input control unit 709 is shut off. Therefore, when the memory addresses in RAM 717 are filled with data, no voice message data can be stored into RAM 717. Thus, according to the present mode it can be avoided that the names and telephone numbers of the data bank apparatus are accidentally erased.

If memory areas are available in RAM 717, the name and telephone number of the next person can be temporarily stored into temporary storage register 724 by operating switches $SW_2$ and $SW_3$ in a manner similar to the above and can be sequentially input and stored into RAM 717. However, in this case, of address data when the name and telephone number of a person which were previously input and stored, is stored in temporary storage circuit 735. Therefore, a signal representing that the addresses have already been counted down in RAM 717 is output from number detecting circuit 729 and AND gate 730 is closed. Thus, address counter 719 is not reset to the last address but the names and telephone numbers of the second and subsequent persons are sequentially stored.

Finally the circuit arrangement for reading out the names and telephone numbers of other persons written into RAM 717 is constituted by operating switch $SW_1$ ON and by operating switch $SW_4$ (namely, logic "1" is set into bit area 711C for the writing/readout mode). Upon operation of the switch $SW_1$, signal $D_0$ is output from input control unit 709 to address control unit 715 and a gate 738, so that gate 738 is opened. In addition, signal $D_0$ is input to a leading edge detecting circuit 739 and a timer circuit 740 in address control unit 715. The leading edge of signal $D_0$ is detected by leading edge detecting circuit 739, and address counter 719 is preset to the last address through OR gate 731 as mentioned above. Simultaneously, timer circuit 740 operates for, e.g., five seconds, the SR-type FF is set by signal $D_0$, $\phi_2$ signal is input to address counter 719, and the address values of address counter 719 are sequentially counted down from 60. In this case, timer circuit 740 serves as an intermittent timer and outputs a signal to AND gate 734 for every five seconds. Five seconds are used to set the timing to sequentially read out the name and telephone number of each person. For instance, when the name and telephone number of the first person are supplied from RAM 717 through gate 738, storage register 724, and display selector 707 and then displayed by display section 701, the name and telephone number of the second person are similarly displayed in display section 701 through each circuit block after five seconds. In this case, the name and telephone number data is displayed in time display section 701A of display section 701 in place of the time display. It is understood that the display selector 707 includes a converter (not shown in detail) for converting the name and telephone data into a predetermined signal form so as to be displayed on the display section 701.

When the name and telephone data stored in RAM 717 is sequentially read out, and the name and telephone number of the last person are read out as described above (namely, when the address data in temporary storage circuit 735 coincides with the address value upon readout mentioned above), an A signal is output to OR gate 741 and SR-type FF 732 is reset and the readout operation of the data from RAM 717 is accomplished.

According to the voice message recording apparatus 700 of the present invention having the circuit block diagram as explained above, by operating switches $SW_2$ and $SW_4$, the voice message data input from microphone 702 can be stored into RAM 717 to record the voice message. In addition, the recorded quantity proportional to the recording time of the voice message data stored in RAM 717 is simultaneously displayed in display section 701. The address data displayed in display section 701 is increased and displayed in the direction from address 0 to address 60 in accordance with the storage of the voice message data as shown in FIG. 9A.

On the other hand, by observing the display section 701 from the outside, the operator can check whether the voice message data has been stored in RAM 717 or not. Due to this confirmation, the residual amount of memory capacity of RAM 717 is discriminated. For instance, in the case where there is the residual memory capacity of (30 to 45) as shown in FIG. 9A or where no voice message data is stored at all, the name and telephone number can be stored in RAM 717 to record the voice message.

To allow RAM 717 to execute the foregoing data bank function, switches $SW_2$ to $SW_5$ are operated. Even in this case as well, the address values of the name and telephone number which are stored into RAM 717 are simultaneously sequentially displayed in address data display section 701B of display section 701. In addition, since those address values are sequentially moved and displayed in the direction from address 60 to address 0, the data bank function may be automatically stopped when the address values of the name and telephone number coincide with the address values of the voice message data in FIG. 9B.

Although the data bank function to store the data other than the voice message data into RAM 717 has been described with respect to the name and telephone number in the fourth mode, the invention is not limited to the name and telephone number. For example, a simple message, address of other person, schedule, or the like may be stored into the RAM.

Further, although the fourth mode has been constituted to write the data other than the voice message into RAM 717 to record the voice message by use of the circuit block diagram of FIG. 10, the invention is not limited to the foregoing circuit block. Other circuits constructed such as to write data other than the voice message into the memory, and to record the voice message may be similarly used.

In addition, the voice message recording apparatus of the present invention is not limited to the electronic wrist watch but may be applied to other small-sized electronic appliances.

What is claimed is:

1. A recording/reproducing apparatus, comprising:

key input means operative for inputting digital input data;

speech synthesizing circuit means arranged to be coupled to said key input means for producing speech-synthesized data from the digital input data;

acoustic converter means for converting incoming speech sounds to a speech signal;

selecting means coupled to said speech synthesizing circuit means and said acoustic converter means for selecting one of said speech signal and said speech synthesized data;

encoding means coupled to said selecting means for encoding the one of said speech signal and said speech synthesized data which is selected by said selecting means, and producing corresponding encoded data;

encoded data storing means including a memory for storing said encoded data at a number of address regions;

addressing means coupled to said encoded data storing means for addressing the regions of said storing means;

readout control means associated with said addressing means for reading the speech encoded data out from said encoded data storing means by controlling the addressing operation of said addressing means;

decoding means coupled to said storing means for decoding the speech encoded data when read out by the readout control means, into a decoded speech signal; and speech generating means coupled to said decoding means for generated the decoded speech signal in the form of audible speech.

2. The apparatus according to claim 1, comprising:

temporary memory means for temporarily storing the speech encoded data when read out by said readout control means; and memory control means for re-storing in said encoded data storing means, the speech encoded data stored in said temporary storing means.

3. The apparatus according to claim 1, comprising:

means for generating time data;

alarm time storage means for storing pre-set alarm data;

means for displaying at least one of said time data and said alarm data; and coincidence detection means coupled to said time data generating means and said alarm time storage means for detecting a coincidence between said time data and said alarm data to produce a coincidence signal, wherein said readout control means is arranged to read the speech encoded data out from said encoded data storing means in response to said coincidence signal.

4. The apparatus according to claim 1, wherein said acoustic converter means comprises a microphone and an amplifier.

5. The apparatus according to claim 1, including a low-pass filter coupled to an output of said selecting means for supplying the selected one of said speech signal and said speech synthesized data to said encoding means.

6. The apparatus according to claim 1, comprising:

presetting means for presetting a desired address into said addressing means; and means for storing said speech encoded data at an address region of the memory in said encoded data storing means which is situated next adjacent to a preset address region.

7. The apparatus according to claim 1, wherein said encoded data storing means comprises a semiconductor memory chip.

8. The apparatus according to claim 1, wherein said encoded data storing means comprises a detachable card-shaped body, and a semiconductor memory chip embedded in said card-shaped body.

9. The apparatus according to claim 8, wherein said semiconductor memory chip is a random access memory chip, and including a battery cell in said card-shaped body for energizing said memory chip.

10. A recording/reproducing apparatus, comprising:

key input means for inputting digital input data;

acoustic converting means for converting incoming speech sounds to a speech signal;

encoding means coupled to said acoustic converting means for encoding the converted speech signal to produce digital speech data;

selecting means coupled to said key input means and said encoding means for selecting one of said digital input data and said digital speech data;

selected data storing means for storing data identifying which digital data is selected by said selecting means;

digital data storing means for storing the digital data selected by said selecting means;

readout control means for reading out the digital data stored in said digital data storing means and the identifying data stored in said selected data storing means;

speech synthesizing circuit means for producing speech-synthesized data from the digital data read from said digital data storing means when the identifying data read out by said readout control means indictaes said digital input data;

decoding means for decoding the digital data read from said digital data storing means to speech data when the identifying data read out by said readout control means indicates said digital speech data; and speech generating means associated with said speech synthesizing circuit means and said decoding means, for generating a selected one of said speech-synthesized data and said speech data in the form of audible speech.

11. The apparatus according to claim 10, wherein said digital data storing means comprises a semiconductor memory chip.

12. The apparatus according to claim 10, wherein said digital data storing means comprises a detachable card-shaped body, and a semiconductor memory chip embedded in said card-shaped body.

13. The apparatus according to claim 12, wherein said semiconductor chip is a random access memory chip, and including a battery cell in said card-shaped body for energizing said memory chip.

14. A recording/reproducing apparatus, comprising:

means for generating a reference signal;

time count means for counting the reference signal to obtain present time data;

display means for displaying said present time data;

acoustic converter means for converting incoming speech sounds to a speech signal;

coding means coupled to said acoustic converter means for encoding the converted speech signals into digital speech data;

storage means coupled to said coding means including at least firts and second storage regions, for temporarily storing said digital speech data in said first storage region;

recording control means for storing said present time data in the second storage region of said storage means when said digital speech data is temporarily stored in said first storage region;

readout control means for reading said present time data out from said second storage region when said digital speech data is read out from said first storage region;

display control means for displaying, on said display means, the present time data which is read by said readout control means;

means coupled to said storage means for decoding the digital speech data read out from the first storage region into an analog speech signal; and means for converting said analog speech signal into a corresponding acoustic message sound.

15. The apparatus according to claim 14, wherein said time count means comprises means for producing time and date signals.

16. The apparatus according to claim 14, comprising:

means for storing preset time data; and means for reading said digital speech data from the first storage region of said storage means when time data corresponding to the preset time data stored in said time data storing means is also stored in the second storage region of said storage means.

17. The apparatus according to claim 14, wherein said first storage means comprises a semiconductor memory chip.

18. The apparatus according to claim 14, wherein said first storage means comprises a detachable card-shaped body, and a semiconductor memory chip embedded in said card-shaped body.

19. The apparatus according to claim 18, wherein said semiconductor memory chip is a random access memory chip and including a battery cell in said card-shaped body for energizing said memory chip.

20. A recording/reproducing apparatus, comprising:

key input means operative for inputting digital input data;

acoustic converter means for converting incoming speech sounds to a speech message signal;

encoding means coupled to said converter means for encoding converted speech message signals into digital speech data;

selecting means for selecting one of said digital input data from said key input means, and said digital speech data from said encoding means;

digital data storing means including a number of address regions, for storing the digital data selected by said selecting means;

addressing means for addressing the regions of said digital data storing means, said addressing means including means for addressing a different region depending upon whether the digital data selected by said selecting means is said digital input data or said digital speech data;

readout control means for reading one of said digital input data and said digital speech data out from said digital data storing means by controlling operation of said addressing means and addressing a respective differet region of said storing means;

display means for displaying said digital input data when the digital data read by the readout control means corresponds to said digital input data;

decoding means for decoding said digital speech data as a speech signal when the digital data read by said readout control means is said digital speech data; and speech generating means coupled to said decoding means for generating audible speech on the basis of said speech signal.

21. The apparatus according to claim 20, comprising:

means for generating time data based on self-oscillated reference clock pulse signals, and means for selecting said time data and the digital data read out from said digital data storing means to permit display of at least one of said time data and said digital data.

22. The apparatus according to claim 20, wherein said display means further displays recording conditions of said digital data storing means, for enabling visual recognition of whether or not said digital speech data can be recorded in said digital data storage means.

23. The apparatus according to claim 20, wherein said addressing means includes means for sequentially addressing a number of address regions of said digital data storing means in one direction from a given address when said digital speech data is selected by said selecting means, and for sequentially addressing said number of address regions in an opposite direction from said given address when said digital input data is selected by said selecting means.

* * * * *